(12) United States Patent
Dhar et al.

(10) Patent No.: US 6,482,551 B1
(45) Date of Patent: *Nov. 19, 2002

(54) OPTICAL ARTICLE AND PROCESS FOR FORMING ARTICLE

(75) Inventors: Lisa Dhar, New Providence, NJ (US); Arturo Hale, New York, NY (US); Howard Edan Katz, Summit, NJ (US); Marcia Lea Schilling, Basking Ridge, NJ (US); Melinda Lamont Schnoes, South Amboy, NJ (US)

(73) Assignee: InPhase Technologies, Longmont, CO (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/208,557

(22) Filed: Dec. 9, 1998

Related U.S. Application Data

(63) Continuation-in-part of application No. 09/046,822, filed on Mar. 24, 1998, now Pat. No. 6,103,454.

(51) Int. Cl.7 .................................................. G03H 1/00
(52) U.S. Cl. ........................... 430/1; 430/2; 430/290; 430/281.1; 359/3
(58) Field of Search .......................... 430/1, 2, 290, 430/945, 281.1; 359/1, 3; 385/49, 12, 2

(56) References Cited

U.S. PATENT DOCUMENTS

| | | | |
|---|---|---|---|
| 3,389,114 A | 6/1968 | Burzynski et al. | 260/32.3 |
| 3,428,599 A | 2/1969 | Newing, Jr. | 260/46.5 |
| 3,474,070 A | 10/1969 | Levene | 260/46.5 |
| 3,479,316 A | 11/1969 | Levene | 260/33.4 |
| 3,953,620 A * | 4/1976 | Chandross et al. | 430/290 |

(List continued on next page.)

FOREIGN PATENT DOCUMENTS

| | | | |
|---|---|---|---|
| EP | 0407773 | 1/1991 | |
| EP | 0620501 * | 10/1994 | 430/2 |
| EP | 0824222 | 2/1998 | |
| FR | 2667073 A | 3/1992 | |
| JP | 52-138146 * | 11/1977 | |

(List continued on next page.)

OTHER PUBLICATIONS

Glebov, L.B., et al., "photorefraction in 'Porous Xerogel--Photopolymer' composite materials.", Sov. Tehc., Phys. Lett., vol. 16(6), pp. 445–446, Jun. 1990.*

*Primary Examiner*—Martin Angebranndt
(74) *Attorney, Agent, or Firm*—DeMont & Breyer, LLC

(57) ABSTRACT

The optical article of the invention, e.g., holographic recording medium or polymeric waveguide, is formed by mixing a matrix precursor and a photoactive monomer, and curing the mixture to form the matrix in situ. The reaction by which the matrix precursor is polymerized during the cure is independent from the reaction by which the photoactive monomer is polymerized during writing of data. In addition, the matrix polymer and the polymer resulting from polymerization of the photoactive monomer are compatible with each other. Use of a matrix precursor and photoactive monomer that polymerize by independent reactions substantially prevents cross-reaction between the photoactive monomer and the matrix precursor during the cure and inhibition of subsequent monomer polymerization. Use of a matrix precursor and photoactive monomer that result in compatible polymers substantially avoids phase separation. And in situ formation allows fabrication of articles with desirable thicknesses.

2 Claims, 1 Drawing Sheet

U.S. PATENT DOCUMENTS

| | | | |
|---|---|---|---|
| 3,957,497 A | 5/1976 | Gray | 106/48 |
| 4,223,121 A | 9/1980 | Burzynski | 528/12 |
| 4,242,252 A | 12/1980 | Newing | 260/33.4 |
| 4,539,232 A | 9/1985 | Burzynski | 427/387 |
| 4,551,361 A | 11/1985 | Burzynski | 427/164 |
| 4,689,000 A * | 8/1987 | Kouchi et al. | 425/57 |
| 4,842,968 A | 6/1989 | Kojima | 430/1 |
| 4,913,990 A * | 4/1990 | Rallison | 430/1 |
| 4,970,129 A * | 11/1990 | Ingwall et al. | 430/2 |
| 5,116,703 A | 5/1992 | Badesha et al. | 430/59 |
| 5,231,156 A | 7/1993 | Lin | 526/279 |
| 5,384,376 A | 1/1995 | Tunney et al. | 525/431 |
| 5,412,043 A | 5/1995 | Novak | 525/479 |
| 5,496,670 A | 3/1996 | Hvilsted et al. | 430/56 |
| 5,527,871 A | 6/1996 | Tuni et al. | 528/10 |
| 5,570,442 A * | 10/1996 | Arii et al. | 385/46 |
| 5,607,799 A | 3/1997 | Moerner et al. | 430/1 |
| 5,665,494 A | 9/1997 | Kawabata et al. | 430/1 |
| 5,698,345 A * | 12/1997 | Ohe et al. | 430/1 |
| 5,776,634 A * | 7/1998 | Ohkuma et al. | 430/1 |
| 5,874,187 A * | 2/1999 | Colvin et al. | 430/1 |

FOREIGN PATENT DOCUMENTS

| | | | | |
|---|---|---|---|---|
| JP | 54-007940 | * | 1/1979 | |
| JP | 54-088144 | * | 7/1979 | |
| JP | 58163903 | | 9/1983 | |
| JP | 59071004 | | 4/1984 | |
| JP | 59-152406 | * | 8/1984 | |
| JP | 60072927 | | 4/1985 | |
| JP | 05-108000 | * | 4/1993 | 359/3 |
| JP | 05-188843 | * | 7/1993 | 359/3 |
| JP | 06-148880 | * | 5/1994 | 430/1 |
| WO | 92/20016 | * | 11/1992 | 359/3 |

* cited by examiner

OPTICAL ARTICLE AND PROCESS FOR FORMING ARTICLE

CROSS-REFERENCE TO RELATED APPLICATIONS

This application is a continuation-in-part of application Ser. No. 09/046,822, filed on Mar. 24, 1998, now U.S. Pat. No. 6,103,454.

BACKGROUND OF THE INVENTION

1. Field of the Invention

The invention relates to optical articles including holographic recording media, in particular media useful either with holographic storage systems or as components such as optical filters or beam steerers.

2. Discussion of the Related Art

Developers of information storage devices and methods continue to seek increased storage capacity. As part of this development, so-called page-wise memory systems, in particular holographic systems, have been suggested as alternatives to conventional memory devices. Page-wise systems involve the storage and readout of an entire two-dimensional representation, e.g., a page, of data. Typically, recording light passes through a two-dimensional array of dark and transparent areas representing data, and the holographic system stores, in three dimensions, holographic representations of the pages as patterns of varying refractive index imprinted into a storage medium. Holographic systems are discussed generally in D. Psaltis et al., "Holographic Memories," *Scientific American*, November 1995, the disclosure of which is hereby incorporated by reference. One method of holographic storage is phase correlation multiplex holography, which is described in U.S. Pat. No. 5,719,691 issued Feb. 17, 1998, the disclosure of which is hereby incorporated by reference. In one embodiment of phase correlation multiplex holography, a reference light beam is passed through a phase mask, and intersected in the recording medium with a signal beam that has passed through an array representing data, thereby forming a hologram in the medium. The spatial relation of the phase mask and the reference beam is adjusted for each successive page of data, thereby modulating the phase of the reference beam and allowing the data to be stored at overlapping areas in the medium. The data is later reconstructed by passing a reference beam through the original storage location with the same phase modulation used during data storage. It is also possible to use volume holograms as passive optical components to control or modify light directed at the medium, e.g., filters or beam steerers. Writing processes that provide refractive index changes are also capable of forming articles such as waveguides.

FIG. 1 illustrates the basic components of a holographic system 10. System 10 contains a modulating device 12, a photorecording medium 14, and a sensor 16. Modulating device 12 is any device capable of optically representing data in two-dimensions. Device 12 is typically a spatial light modulator that is attached to an encoding unit which encodes data onto the modulator. Based on the encoding, device 12 selectively passes or blocks portions of a signal beam 20 passing through device 12. In this manner, beam 20 is encoded with a data image. The image is stored by interfering the encoded signal beam 20 with a reference beam 22 at a location on or within photorecording medium 14. The interference creates an interference pattern (or hologram) that is captured within medium 14 as a pattern of, for example, varying refractive index. It is possible for more than one holographic image to be stored at a single location, or for holograms to be stored in overlapping positions, by, for example, varying the angle, the wavelength, or the phase of the reference beam 22, depending on the particular reference beam employed. Signal beam 20 typically passes through lens 30 before being intersected with reference beam 22 in the medium 14. It is possible for reference beam 22 to pass through lens 32 before this intersection. Once data is stored in medium 14, it is possible to retrieve the data by intersecting reference beam 22 with medium 14 at the same location and at the same angle, wavelength, or phase at which reference beam 22 was directed during storage of the data. The reconstructed data passes through lens 34 and is detected by sensor 16. Sensor 16 is, for example, a charged coupled device or an active pixel sensor. Sensor 16 typically is attached to a unit that decodes the data.

The capabilities of such holographic storage systems are limited in part by the storage media. Iron-doped lithium niobate has been used as a storage medium for research purposes for many years. However, lithium niobate is expensive, exhibits poor sensitivity (1 J/cm$^2$), has low index contrast ($\Delta$n of about $10^{-4}$), and exhibits destructive read-out (i.e., images are destroyed upon reading). Alternatives have therefore been sought, lo particularly in the area of photosensitive polymer films. See, e.g., W. K. Smothers et al., "Photopolymers for Holography," SPIE OE/Laser Conference, 1212–03, Los Angeles, Calif., 1990. The material described in this article contains a photoimageable system containing a liquid monomer material (the photoactive monomer) and a photoinitiator (which promotes the polymerization of the monomer upon exposure to light), where the photoimageable system is in an organic polymer host matrix that is substantially inert to the exposure light. During writing of information into the material (by passing recording light through an array representing data), the monomer polymerizes in the exposed regions. Due to the lowering of the monomer concentration caused by the polymerization, monomer from the dark, unexposed regions of the material diffuses to the exposed regions. The polymerization and resulting concentration gradient create a refractive index change, forming the hologram representing the data. Unfortunately, deposition onto a substrate of the pre-formed matrix material containing the photoimageable system requires use of solvent, and the thickness of the material is therefore limited, e.g., to no more than about 150 $\mu$m, to allow enough evaporation of the solvent to attain a stable material and reduce void formation. In holographic processes such as described above, which utilize three-dimensional space of a medium, the storage capacity is proportional to a medium's thickness. Thus, the need for solvent removal inhibits the storage capacity of a medium. (Holography of this type is typically referred to as volume holography because a Klein-Cook Q parameter greater than 1 is exhibited (see W. Klein and B. Cook, "Unified approach to ultrasonic light diffraction," *IEEE Transaction on Sonics and Ultrasonics*, SU-14, 1967, at 123–134). In volume holography, the media thickness is generally greater than the fringe spacing,)

U.S. patent application Ser. No. 08/698,142 (our reference Colvin-Harris-Katz-Schilling 1-2-16-10), the disclosure of which is hereby incorporated by reference, also relates to a photoimageable system in an organic polymer matrix, but allows fabrication of thicker media. In particular, the application discloses a recording medium formed by polymerizing matrix material in situ from a fluid mixture of organic oligomer matrix precursor and a photoimageable system. A similar type of system, but which does not incorporate oligomers, is discussed in D. J. Lougnot et al., *Pure and Appl. Optics*, 2, 383 (1993). Because little or no solvent is typically required for deposition of these matrix materials, greater thicknesses are possible, e.g., 200 μm and above. However, while useful results are obtained by such processes, the possibility exists for reaction between the precursors to the matrix polymer and the photoactive monomer. Such reaction would reduce the refractive index contrast between the matrix and the polymerized photoactive monomer, thereby affecting to an extent the strength of the stored hologram.

Thus, while progress has been made in fabricating photorecording media suitable for use in holographic storage systems, further progress is desirable. In particular, media which are capable of being formed in relatively thick layers, e.g., greater than 200 μm, which substantially avoid reaction between the matrix material and photomonomer, and which exhibit useful holographic properties, are desired.

SUMMARY OF THE INVENTION

The invention constitutes an improvement over prior recording media. The invention's use of a matrix precursor (i.e., the one or more compounds from which the matrix is formed) and a photoactive monomer that polymerize by independent reactions substantially prevents both cross-reaction between the photoactive monomer and the matrix precursor during the cure, and inhibition of subsequent monomer polymerization. Use of a matrix precursor and photoactive monomer that form compatible polymers substantially avoids phase separation. And in situ formation allows fabrication of media with desirable thicknesses. These material properties are also useful for forming a variety of optical articles (optical articles being articles that rely on the formation of refractive index patterns or modulations in the refractive index to control or modify light that is directed at them). In addition to recording media, such articles include, but are not limited to, optical waveguides, beam steerers, and optical filters. Independent reactions indicate: (a) the reactions proceed by different types of reaction intermediates, e.g., ionic vs. free radical, (b) neither the intermediate nor the conditions by which the matrix is polymerized will induce substantial polymerization of the photoactive monomer functional groups, i.e., the group or groups on a photoactive monomer that are the reaction sites for polymerization during the pattern (e.g., hologram) writing process (substantial polymerization indicates polymerization of more than 20% of the monomer functional groups), and (c) neither the intermediate nor the conditions by which the matrix is polymerized will induce a non-polymerization reaction of the monomer functional groups that either causes cross-reaction between monomer functional groups and the matrix or inhibits later polymerization of the monomer functional groups. Polymers are considered to be compatible if a blend of the polymers is characterized, in 90° light scattering of a wavelength used for hologram formation, by a Rayleigh ratio ($R_{90}°$) less than $7\times10^{-3}$ cm$^{-1}$. The Rayleigh ratio ($R_\theta$) is a conventionally known property, and is defined as the energy scattered by a unit volume in the direction θ, per steradian, when a medium is illuminated with a unit intensity of unpolarized light, as discussed in M. Kerker, *The Scattering of Light and Other Electromagnetic Radiation*, Academic Press, San Diego, 1969, at 38. The Rayleigh ratio is typically obtained by comparison to the energy scatter of a reference material having a known Rayleigh ratio. Polymers which are considered to be miscible, e.g., according to conventional tests such as exhibition of a single glass transition temperature, will typically be compatible as well. But polymers that are compatible will not necessarily be miscible. In situ indicates that the matrix is cured in the presence of the photoimageable system. A useful photorecording material, i.e., the matrix material plus the photoactive monomer, photoinitiator, and/or other additives, is attained, the material capable of being formed in thicknesses greater than 200 μm, advantageously greater than 500 μm, and, upon flood exposure, exhibiting light scattering properties such that the Rayleigh ratio, $R_{90}$, is less than $7\times10^{-3}$. (Flood exposure is exposure of the entire photorecording material by incoherent light at wavelengths suitable to induce substantially complete polymerization of the photoactive monomer throughout the material.)

The optical article of the invention is formed by steps including mixing a matrix precursor and a photoactive monomer, and curing the mixture to form the matrix in situ. As discussed previously, the reaction by which the matrix precursor is polymerized during the cure is independent from the reaction by which the photoactive monomer is later polymerized during writing of a pattern, e.g., data or waveguide form, and, in addition, the matrix polymer and the polymer resulting from polymerization of the photoactive monomer (hereafter referred to as the photopolymer) are compatible with each other. (The matrix is considered to be formed when the photorecording material exhibits an elastic modulus of at least about $10^5$ Pa. Curing indicates reacting the matrix precursor such that the matrix provides this elastic modulus in the photorecording material.) The optical article of the invention contains a three-dimensional crosslinked polymer matrix and one or more photoactive monomers. At least one photoactive monomer contains one or more moieties, excluding the monomer functional groups, that are substantially absent from the polymer matrix. (Substantially absent indicates that it is possible to find a moiety in the photoactive monomer such that no more than 20% of all such moieties in the photorecording material are present, i.e., covalently bonded, in the matrix.) The resulting independence between the host matrix and the monomer offers useful recording properties in holographic media and desirable properties in waveguides such as enabling formation of large modulations in the refractive index without the need for high concentrations of the photoactive monomer. Moreover, it is possible to form the material of the invention without the disadvantageous solvent development required previously.

In contrast to a holographic recording medium of the invention, media which utilize a matrix precursor and photoactive monomer that polymerize by non-independent reactions often experience substantial cross-reaction between the precursor and the photoactive monomer during the matrix cure (e.g., greater than 20% of the monomer is attached to the matrix after cure), or other reactions that inhibit polymerization of the photoactive monomer. Cross-reaction tends to undesirably reduce the refractive index contrast between the matrix and the photoactive monomer and is capable of affecting the subsequent polymerization of the photoactive monomer, and inhibition of monomer polymerization clearly affects the process of writing holograms. As for compatibility, previous work has been concerned with the compatibility of the photoactive monomer in a matrix polymer, not the compatibility of the resulting photopolymer in the matrix. Yet, where the photopolymer and matrix polymer are not compatible, phase separation typically occurs during hologram formation. It is possible for such phase separation to lead to increased light scattering, reflected in haziness or opacity, thereby degrading the quality of the medium, and the fidelity with which stored data is capable of being recovered

DETAILED DESCRIPTION OF THE INVENTION

Figure 1:
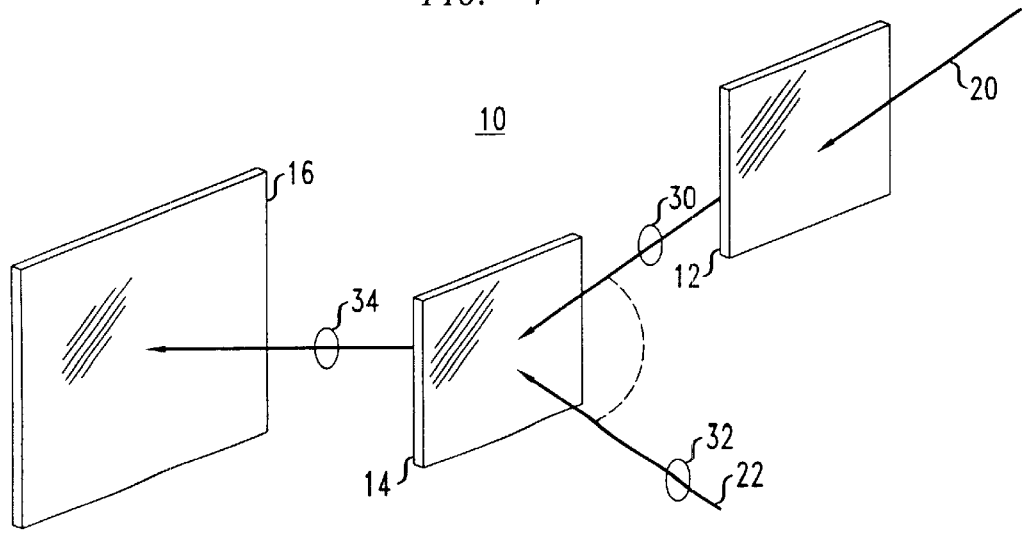
FIG. 1 shows a basic holographic storage system.

The optical article, e.g., holographic recording medium, of the invention is formed by steps including mixing a matrix precursor and a photoactive monomer, and curing the mixture to form the matrix in situ. The matrix precursor and photoactive monomer are selected such that (a) the reaction by which the matrix precursor is polymerized during the cure is independent from the reaction by which the photoactive monomer will be polymerized during writing of a pattern, e.g., data, and (b) the matrix polymer and the polymer resulting from polymerization of the photoactive monomer (the photopolymer) are compatible with each other. As discussed previously, the matrix is considered to be formed when the photorecording material, i.e., the matrix material plus the photoactive monomer, photoinitiator, and/or other additives, exhibits an elastic modulus of at least about $10^5$ Pa, generally about $10^5$ Pa to about $10^9$ Pa, advantageously about $10^6$ Pa to about $10^8$ Pa.

The compatibility of the matrix polymer and photopolymer tends to prevent large-scale (>100 nm) phase separation of the components, such large-scale phase separation typically leading to undesirable haziness or opacity. Utilization of a photoactive monomer and a matrix precursor that polymerize by independent reactions provides a cured matrix substantially free of cross-reaction, i.e., the photoactive monomer remains substantially inert during the matrix cure. In addition, due to the independent reactions, there is no inhibition of subsequent polymerization of the photoactive monomer. At least one photoactive monomer contains one or more moieties, excluding the monomer functional groups, that are substantially absent from the polymer matrix, i.e., it is possible to find a moiety in the photoactive monomer such that no more than 20% of all such moieties in the photorecording material are present, i.e., covalently bonded, in the matrix. The resulting optical article is capable of exhibiting desirable refractive index contrast due to the independence of the matrix from the photoactive monomer.

As discussed above, formation of a hologram, waveguide, or other optical article relies on a refractive index contrast ($\Delta n$) between exposed and unexposed regions of a medium, this contrast at least partly due to monomer diffusion to exposed regions. High index contrast is desired because it provides improved signal strength when reading a hologram, and provides efficient confinement of an optical wave in a waveguide. One way to provide high index contrast in the invention is to use a photoactive monomer having moieties (referred to as index-contrasting moieties) that are substantially absent from the matrix, and that exhibit a refractive index substantially different from the index exhibited by the bulk of the matrix. For example, high contrast would be obtained by using a matrix that contains primarily aliphatic or saturated alicyclic moieties with a low concentration of heavy atoms and conjugated double bonds (providing low index) and a photoactive monomer made up primarily of aromatic or similar high-index moieties.

The matrix is a solid polymer formed in situ from a matrix precursor by a curing step (curing indicating a step of inducing reaction of the precursor to form the polymeric matrix). It is possible for the precursor to be one or more monomers, one or more oligomers, or a mixture of monomer and oligomer. In addition, it is possible for there to be greater than one type of precursor functional group, either on a single precursor molecule or in a group of precursor molecules. (Precursor functional groups are the group or groups on a precursor molecule that are the reaction sites for polymerization during matrix cure.) To promote mixing with the photoactive monomer, the precursor is advantageously liquid at some temperature between about −50° C. and about 80° C. Advantageously, the matrix polymerization is capable of being performed at room temperature. Also advantageously, the polymerization is capable of being performed in a time period less than 300 minutes, advantageously 5 to 200 minutes. The glass transition temperature ($T_g$) of the photorecording material is advantageously low enough to permit sufficient diffusion and chemical reaction of the photoactive monomer during a holographic recording process. Generally, the $T_g$ is not more than 50° C. above the temperature at which holographic recording is performed, which, for typical holographic recording, means a $T_g$ between about 80° C. and about −130° C. (as measured by conventional methods). It is also advantageous for the matrix to exhibit a three-dimensional network structure, as opposed to a linear structure, to provide the desired modulus discussed previously.

Examples of polymerization reactions contemplated for forming matrix polymers in the invention include cationic epoxy polymerization, cationic vinyl ether polymerization, cationic alkenyl ether polymerization, cationic allene ether polymerization, cationic ketene acetal polymerization, epoxy-amine step polymerization, epoxy-mercaptan step polymerization, unsaturated ester-amine step polymerization (via Michael addition), unsaturated ester-mercaptan step polymerization (via Michael addition), vinyl-silicon hydride step polymerization (hydrosilylation), isocyanate-hydroxyl step polymerization (urethane formation), and isocyanate-amine step polymerization (urea formation).

Several such reactions are enabled or accelerated by suitable catalysts. For example, cationic epoxy polymerization takes place rapidly at room temperature by use of $BF_3$-based catalysts, other cationic polymerizations proceed in the presence of protons, epoxy-mercaptan reactions and Michael additions are accelerated by bases such as amines, hydrosilylation proceeds rapidly in the presence of transition metal catalysts such as platinum, and urethane and urea formation proceed rapidly when tin catalysts are employed. It is also possible to use photogenerated catalysts for matrix formation, provided that steps are taken to prevent polymerization of the photoactive monomer during the photogeneration.

The photoactive monomer is any monomer or monomers capable of undergoing photoinitiated polymerization, and which, in combination with a matrix material, meets the polymerization reaction and compatibility requirements of the invention. Suitable photoactive monomers include those which polymerize by a free-radical reaction, e.g., molecules containing ethylenic unsaturation such as acrylates, methacrylates, acrylamides, methacrylamides, styrene, substituted styrenes, vinyl naphthalene, substituted vinyl naphthalenes, and other vinyl derivatives. Free-radical copolymerizable pair systems such as vinyl ether mixed with maleate and thiol mixed with olefin are also suitable. It is also possible to use cationically polymerizable systems such as vinyl ethers, alkenyl ethers, allene ethers, ketene acetals, and epoxies. It is also possible for a single photoactive monomer molecule to contain more than one monomer functional group.

As mentioned previously, relatively high index contrast is desired in the article of the invention, whether for improved readout in a recording media or efficient light confinement in a waveguide. In addition, it is advantageous to induce this relatively large index change with a small number of monomer functional groups, because polymerization of the monomer generally induces shrinkage in a material. (For instance, in Examples 2 and 3 below, the writing-induced shrinkage due to hologram recording was approximately 0.7%. Example 4 reflects a reduced concentration of photoactive monomer, and an associated reduction in writing-induced shrinkage (0.30 to 0.35%).) Such shrinkage has a detrimental effect on the retrieval of data from stored holograms, and also degrades the performance of waveguide devices such as by increased transmission losses or other performance deviations. Lowering the number of monomer functional groups that must be polymerized to attain the necessary index contrast is therefore desirable. This lowering is possible by increasing the ratio of the molecular volume of the monomers to the number of monomer functional groups on the monomers. This increase is attainable by incorporating into a monomer larger index-contrasting moieties and/or a larger number of index-contrasting moieties. For example, if the matrix is composed primarily of aliphatic or other low index moieties and the monomer is a higher index species where the higher index is imparted by a benzene ring, the molecular volume could be increased relative to the number of monomer functional groups by incorporating a naphthalene ring instead of a benzene ring (the naphthalene having a larger volume), or by incorporating one or more additional benzene rings, without increasing the number of monomer functional groups. In this manner, polymerization of a given volume fraction of the monomers with the larger molecular volume/monomer functional group ratio would require polymerization of less monomer functional groups, thereby inducing less shrinkage. But the requisite volume fraction of monomer would still diffuse from the unexposed region to the exposed region, providing the desired refractive index.

The molecular volume of the monomer, however, should not be so large as to slow diffusion below an acceptable rate. Diffusion rates are controlled by factors including size of diffusing species, viscosity of the medium, and intermolecular interactions. Larger species tend to diffuse more slowly, but it would be possible in some situations to lower the viscosity or make adjustments to the other molecules present in order to raise diffusion to an acceptable level. Also, in accord with the discussion herein, it is important to ensure that larger molecules maintain compatibility with the matrix.

Numerous architectures are possible for monomers containing multiple index-contrasting moieties. For example, it is possible for the moieties to be in the main chain of a linear oligomer, or to be substituents along an oligomer chain. Alternatively, it is possible for the index-contrasting moieties to be the subunits of a branched or dendritic low molecular weight polymer.

In addition to the photoactive monomer, the optical article typically contains a photoinitiator (the photoinitiator and: photoactive monomer being part of the overall photoimageable system). The photoinitiator, upon exposure to relatively low levels of the recording light, chemically initiates the polymerization of the monomer, avoiding the need for direct light-induced polymerization of the monomer. The photoinitiator generally should offer a source of species that initiate polymerization of the particular photoactive monomer. Typically, 0.1 to 20 wt. % photoinitiator, based on the weight of the photoimageable system, provides desirable results.

A variety of photoinitiators known to those skilled in the art and available commercially are suitable for use in the invention. It is advantageous to use a photoinitiator that is sensitive to light in the visible part of the spectrum, particularly at wavelengths available from conventional laser sources, e.g., the blue and green lines of Ar+ (458, 488, 514 nm) and He—Cd lasers (442 nm), the green line of frequency doubled YAG lasers (532 nm), and the red lines of He—Ne (633 nm) and Kr+lasers (647 and 676 nm). One advantageous free radical photoinitiator is bis($\eta$-5-2,4-cyclopentadien-1-yl)bis [2,6-difluoro-3-(1H-pyrrol-1-yl) phenyl]titanium, available commercially from Ciba as CGI-784. Another visible free-radical photoinitiator (which requires a co-initiator) is 5,7,diiodo-3-butoxy-6-fluorone, commercially available from Spectra Group Limited as H-Nu 470. Free-radical photoinitiators of dye-hydrogen donor systems are also possible. Examples of suitable dyes include eosin, rose bengal, erythrosine, and methylene blue, and suitable hydrogen donors include tertiary amines such as n-methyl diethanol amine. In the case of cationically polymerizable monomers, a cationic photoinitiator is used, such as a sulfonium salt or an iodonium salt. These cationic photoinitiator salts absorb predominantly in the UV portion of the spectrum, and are therefore typically sensitized with a dye to allow use of the visible portion of the spectrum. An example of an alternative visible cationic photoinitiator is ($\eta_5$-2,4-cyclopentadien-1-yl) ($\eta_6$-isopropylbenzene)-iron (II) hexafluorophosphate, available commercial from Ciba as Irgacure 261. It is also conceivable to use other additives in the photoimageable system, e.g., inert diffusing agents having relatively high or low refractive indices.

Advantageously, for holographic recording, the matrix is a polymer, formed by mercaptan-epoxy step polymerization, more advantageously a polymer formed by mercaptan-epoxy step polymerization having a polyether backbone. The polyether backbone offers desirable compatibility with several useful photoactive monomers, particularly vinyl aromatic compounds. Specifically, photoactive monomers selected from styrene, bromostyrene, divinyl benzene, and 4-methylthio-1-vinylnaphthalene (MTVN) have been found to be useful with matrix polymers formed by mercaptan-epoxy step polymerization and having a polyether backbone. A monomer that has more than one index-contrasting moiety and that is also useful with these polyether matrix polymers is 1-(3-(naphth-1-ylthio)propylthio)-4-vinylnaphthalene.

To be independent, the polymerization reactions for the matrix precursor and the photoactive monomer are selected such that: (a) the reactions proceed by different types of reaction intermediates, (b) neither the intermediate nor the conditions by which the matrix is polymerized will induce substantial polymerization of the photoactive monomer functional groups, and (c) neither the intermediate nor the conditions by which the matrix is polymerized will induce a non-polymerization reaction of the monomer functional groups that causes cross-reaction (between the monomer functional groups and the matrix polymer) or inhibits later polymerization of the monomer functional groups. According to item (a), if a matrix is polymerized by use of an ionic intermediate, it would be suitable to polymerize the photoactive monomer by use of a free radical reaction. In accordance with item (b), however, the ionic intermediate should not induce substantial polymerization of the photoactive monomer functional groups. Also in accordance with item (b), for example, one must be aware that a photoinitiated free radical matrix polymerization will typically induce a photoinitiated cationic polymerization of a photoactive monomer functional group. Thus, two otherwise independent reactions are not independent for purposes of the invention if both are driven by a single reaction condition. In accordance with item (c), for example, base-catalyzed matrix polymerization should not be performed when the photoactive monomer functional group undergoes a non-polymerization reaction in response to the base, even if polymerization of the monomer functional group is performed by an independent reaction. A specific example is that a base-catalyzed epoxy-mercaptan polymerization should not be used with an acrylate monomer because, although the acrylate is polymerized by a free radical reaction, the acrylate will react with the mercaptans under base catalysis, resulting in a cross-reaction.

Table I below illustrates some examples of matrix/photoactive monomer combinations where the matrix polymerization reaction and photoactive monomer polymerization are capable of being independent, and examples where the polymerizations interfere with each other. (Photoactive monomers are horizontal, and matrix polymers are vertical. "X" indicates cross-reaction or monomer polymerization during matrix polymerization. "O" indicates independent reactions. "I" indicates that the photoactive monomer polymerization is inhibited by the reagents or reaction that form the polymeric matrix, e.g., the photoactive monomer functional group is converted to a non-polymerizing group, or chemical species are present after the matrix cure that substantially slow the rate or yield of polymerization of the monomer functional groups.)

| | Photoactive | | | |
|---|---|---|---|---|
| Matrix | (Meth) acrylates | Styrene Derivatives | Vinyl Ethers | Epoxies |
| Cationic Epoxy | O | O | X | X |
| Cationic Vinyl Ethers | O | O | X | X |
| Epoxy (amine) | X | O | I | X |
| Epoxy (mercaptan) | X | O | I | X |
| Unsaturated ester (amine) | X | O | I | X |
| Unsaturated ester (mercaptan) | X | O | I | X |
| Hydrosilylation | X | X | X | O |
| Urethane formation | O | O | O | X |

For purposes of the invention, polymers are considered to be compatible if a blend of the polymers is characterized, in 90° light scattering, by a Rayleigh ratio ($R_{90}°$) less than $7 \times 10^{-3}$ cm$^{-1}$. The Rayleigh ratio, $R_\theta$, is a conventionally known property, and is defined as the energy scattered by a unit volume in the direction θ, per steradian, when a medium is illuminated with a unit intensity of unpolarized light, as discussed in M. Kerker, *The Scattering of Light and Other Electromagnetic Radiation*, Academic Press, San Diego, 1969. The light source used for the measurement is generally a laser having a wavelength in the visible part of the spectrum. Normally, the wavelength intended for use in writing holograms is used. The scattering measurements are made upon a photorecording material that has been flood exposed. The scattered light is collected at an angle of 90° from the incident light, typically by a photodetector. It is possible to place a narrowband filter, centered at the laser wavelength, in front of such a photodetector to block fluorescent light, although such a step is not required. The Rayleigh ratio is typically obtained by comparison to the energy scatter of a reference material having a known Rayleigh ratio.

Polymer blends which are considered to be miscible, e.g., according to conventional tests such as exhibition of a single glass transition temperature, will typically be compatible as well, i.e., miscibility is a subset of compatibility. Standard miscibility guidelines and tables are therefore useful in selecting a compatible blend. However, it is possible for polymer blends that are immiscible to be compatible according to the light scattering test above.

A polymer blend is generally considered to be miscible if the blend exhibits a single glass transition temperature, $T_g$, as measured by conventional methods. An immiscible blend will typically exhibit two glass transition temperatures corresponding to the $T_g$ values of the individual polymers. $T_g$ testing is most commonly performed by differential scanning calorimetry (DSC), which shows the $T_g$ as a step change in the heat flow (typically the ordinate). The reported $T_g$ is typically the temperature at which the ordinate reaches the mid-point between extrapolated baselines before and after the transition. It is also possible to use Dynamic Mechanical Analysis (DMA) to measure $T_g$. DMA measures the storage modulus of a material, which drops several orders of magnitude in the glass transition region. It is possible in certain cases for the polymers of a blend to have individual $T_g$ values that are close to each other. In such cases, conventional methods for resolving such overlapping $T_g$ should be used, such as discussed in Brinke et al., "The thermal characterization of multi-component systems by enthalpy relaxation," *Thermochimica Acta.*, 238 (1994), at 75.

Matrix polymer and photopolymer that exhibit miscibility are capable of being selected in several ways. For example, several published compilations of miscible polymers are available, such as O. Olabisi et al., *Polymer-Polymer Miscibility*, Academic Press, New York, 1979; L. M. Robeson, *MMI. Press Symp. Ser.*, 2, 177, 1982; L. A. Utracki, *Polymer Alloys and Blends: Thermodynamics and Rheology*, Hanser Publishers, Munich, 1989; and S. Krause in *Polymer Handbook*, J. Brandrup and E. H. Immergut, Eds.; 3rd Ed., Wiley Interscience, New York, 1989, pp. VI 347–370, the disclosures of which are hereby incorporated by reference. Even if a particular polymer of interest is not found in such references, the approach specified allows determination of a compatible photorecording material by employing a control sample.

Determination of miscible or compatible blends is further aided by intermolecular interaction considerations that typically drive miscibility. For example, it is well known that polystyrene and poly(methylvinylether) are miscible because of an attractive interaction between the methyl ether group and the phenyl ring. It is therefore possible to promote miscibility, or at least compatibility, of two polymers by using a methyl ether group in one polymer and a phenyl group in the other polymer. It has also been demonstrated that immiscible polymers are capable of being made miscible by the incorporation of appropriate functional groups that can provide ionic interactions. (See Z. L. Zhou and A. Eisenberg, *J. Polym. Sci., Polym. Phys. Ed.*, 21 (4), 595, 1983; R. Murali and A. Eisenberg, *J. Polym. Sci., Part B: Polym. Phys.*, 26 (7), 1385, 1988; and A Natansohn et al., *Makromol. Chem., Macromol. Symp.*, 16, 175, 1988.) For example, polyisoprene and polystyrene are immiscible. However, when polyisoprene is partially sulfonated (5%), and 4-vinyl pyridine is copolymerized with the polystyrene, the blend of these two functionalized polymers is miscible. It is contemplated that the ionic interaction between the sulfonated groups and the pyridine group (proton transfer) is the driving force that makes this blend miscible. Similarly, polystyrene and poly(ethyl acrylate), which are normally immiscible, have been made miscible by lightly sulfonating the polystyrene. (See R. E. Taylor-Smith and R. A. Register, *Macromolecules*, 26, 2802, 1993.) Charge-transfer has also been used to make miscible polymers that are otherwise immiscible. For example it has been demonstrated that, although poly(methyl acrylate) and poly(methyl methacrylate) are immiscible, blends in which the former is copolymerized with (N-ethylcarbazol-3-yl)methyl acrylate (electron donor) and the latter is copolymerized with 2-[(3, 5-dinitrobenzoyl)oxy]ethyl methacrylate (electron accceptor) are miscible, provided the right amounts of donor and acceptor are used. (See M. C. Piton and A. Natansohn, *Macromolecules*, 28, 15, 1995.) Poly(methyl methacrylate) and polystyrene are also capable of being made miscible using the corresponding donor-acceptor co-monomers (See M. C. Piton and A. Natansohn, *Macromolecules*, 28, 1605, 1995).

A variety of test methods exist for evaluating the miscibility or compatibility of polymers, as reflected in the recent overview published in A. Hale and H. Bair, Ch. 4—"Polymer Blends and Block Copolymers," *Thermal Characterization of Polymeric Materials*, 2nd Ed., Academic Press, 1997. For example, in the realm of optical methods, opacity typically indicates a two-phase material, whereas clarity generally indicates a compatible system. Other methods for evaluating miscibility include neutron scattering, infrared spectroscopy (IR), nuclear magnetic resonance (NMR), x-ray scattering and diffraction, fluorescence, Brillouin scattering, melt titration, calorimetry, and chemilluminescence. See, for example, L. Robeson, supra; S. Krause, *Chemtracts—Macromol. Chem.*, 2, 367, 1991a; D. Vesely in *Polymer Blends and Alloys*, M. J. Folkes and P. S. Hope, Eds., Blackie Academic and Professional, Glasgow, pp. 103–125; M. M. Coleman et al. *Specific Interactions and the Miscibility of Polymer Blends*, Technomic Publishing, Lancaster, Pa., 1991; A. Garton, *Infrared Spectroscopy of Polymer Blends Composites and Surfaces*, Hanser, New York, 1992; L. W. Kelts et al., *Macromolecules*, 26, 2941, 1993; and J. L. White and P. A. Mirau, *Macromolecules*, 26, 3049, 1993; J. L. White and P. A. Mirau, *Macromolecules*, 27, 1648, 1994; and C. A. Cruz et al., *Macromolecules*, 12, 726, 1979; and C. J. Landry et al., *Macromolecules*, 26, 35, 1993.

Compatibility has also been promoted in otherwise incompatible polymers by incorporating reactive groups into the polymer matrix, where such groups are capable of reacting with the photoactive monomer during the holographic recording step. Some of the photoactive monomer will thereby be grafted onto the matrix during recording. If there are enough of these grafts, it is possible to prevent or reduce phase separation during recording. However, if the refractive index of the grafted moiety and of the monomer are relatively similar, too many grafts, e.g., more than 30% of monomers grafted to the matrix, will tend to undesirably reduce refractive index contrast.

A holographic recording medium of the invention is formed by adequately supporting the photorecording material, such that holographic writing and reading is possible. Typically, fabrication of the medium involves depositing the matrix precursor/photoimageable system mixture between two plates using, for example, a gasket to contain the mixture. The plates are typically glass, but it is also possible to use other materials transparent to the radiation used to write data, e.g., a plastic such as polycarbonate or poly(methyl methacrylate). It is possible to use spacers between the plates to maintain a desired thickness for the recording medium. During the matrix cure, it is possible for shrinkage in the material to create stress in the plates, such stress altering the parallelism and/or spacing of the plates and thereby detrimentally affecting the medium's optical properties. To reduce such effects, it is useful to place the plates in an apparatus containing mounts, e.g., vacuum chucks, capable of being adjusted in response to changes in parallelism and/or spacing. In such an apparatus, it is possible to monitor the parallelism in real-time by use of a conventional interferometric method, and make any necessary adjustments during the cure. Such a method is discussed, for example, in U.S. patent application Ser. No. 08/867,563 (our reference Campbell-Harris-Levinos 3-5-3), the disclosure of which is hereby incorporated by reference. The photorecording material of the invention is also capable of being supported in other ways. For instance, it is conceivable to dispose the matrix precursor/photoimageable system mixture into the pores of a substrate, e.g., a nanoporous glass material such as Vycor, prior to matrix cure. More conventional polymer processing is also envisioned, e.g., closed mold formation or sheet extrusion. A stratified medium is also contemplated, i.e., a medium containing multiple substrates, e.g., glass, with layers of photorecording material disposed between the substrates.

The medium of the invention is then capable of being used in a holographic system such as discussed previously. The amount of information capable of being stored in a holographic medium is proportional to the product of: the refractive index contrast, $\Delta n$, of the photorecording material, and the thickness, d, of the photorecording material. (The refractive index contrast, $\Delta n$, is conventionally known, and is defined as the amplitude of the sinusoidal variations in the refractive index of a material in which a plane-wave, volume hologram has been written. The refractive index varies as: $n(x)=n_0+\Delta n \cos(K_x)$, where $n(x)$ is the spatially varying refractive index, x is the position vector, K is the grating wavevector, and $n_0$ is the baseline refractive index of the medium. See, e.g., P. Hariharan, *Optical Holography: Principles, Techniques and Applications*, Cambridge University Press, Cambridge, 1991, at 44.) The $\Delta n$ of a material is typically calculated from the diffraction efficiency or efficiencies of a single volume hologram or a multiplexed set of volume holograms recorded in a medium. The $\Delta n$ is associated with a medium before writing, but is observed by measurement performed after recording. Advantageously, the photorecording material of the invention exhibits a $\Delta n$ of $3 \times 10^{-3}$ or higher:

Examples of other optical articles include beam filters, beam steerers or deflectors, and optical couplers. (See, e.g., L. Solymar and D. Cooke, *Volume Holography and Volume Gratings*, Academic Press, 315–327 (1981), the disclosure of which is hereby incorporated by reference.) A beam filter separates part of an incident laser beam that is traveling along a particular angle from the rest of the beam. Specifically, the Bragg selectivity of a thick transmission hologram is able to selectively diffract light along a particular angle of incidence, while light along other angle travels undeflected through the hologram. (See, e.g., J. E. Ludman et al., "Very thick holographic nonspatial filtering of laser beams," *Optical Engineering*, Vol. 36, No. 6, 1700 (1997), the disclosure of which is hereby incorporated by reference.) A beam steerer is a hologram that deflects light incident at the Bragg angle. An optical coupler is typically a combination of beam deflectors that steer light from a source to a target. These articles, typically referred to as holographic optical elements, are fabricated by imaging a particular optical interference pattern within a recording medium, as discussed previously with respect to data storage. Medium for these holographic optical elements are capable of being formed by the techniques discussed herein for recording media or waveguides.

As mentioned previously, the materials principles discussed herein are applicable not only to hologram formation, but also to formation of optical transmission devices such as waveguides. Polymeric optical waveguides are discussed for example in B. L. Booth, "Optical Interconnection Polymers," in *Polymers for Lightwave and Integrated Optics, Technology and Applications*, L. A. Hornak, ed., Marcel Dekker, Inc. (1992); U.S. Pat. No. 5,292,620; and U.S. Pat. No. 5,219,710, the disclosures of which are hereby incorporated by reference. Essentially, the recording material of the invention is irradiated in a desired waveguide pattern to provide refractive index contrast between the waveguide pattern and the surrounding (cladding) material. It is possible for exposure to be performed, for example, by a focused laser light or by use of a mask with a non-focused light source. Generally, a single layer is exposed in this manner to provide the waveguide pattern, and additional layers are added to complete the cladding, thereby completing the waveguide. This process is discussed for example at pages 235–36 of Booth, supra, and Cols. 5 and 6 of U.S. Pat. No. 5,292,620. A benefit of the invention is that by using conventional molding techniques, it is possible to mold the matrix/photoimageable system mixture into a variety of shapes prior to matrix cure. For example, the matrix/photoimageable system mixture is able to be molded into ridge waveguides, wherein refractive index patterns are then written into the molded structures. It is thereby possible to easily form structures such as Bragg gratings. This feature of the invention increases the breadth of applications in which such polymeric waveguides would be useful.

The invention will be further clarified by the following examples, which are intended to be exemplary.

COMPARATIVE EXAMPLE 1

A solution was prepared containing 89.25 wt. % phenoxyethyl acrylate (photoactive monomer), 10.11 wt. % ethoxylated bisphenol-A diacrylate (photoactive monomer), 0.5 wt. % Ciba CGI-784 (identified previously) (photoinitiator), and 0.14 wt. % dibutyltin dilaurate (catalyst for matrix formation). 0.0904 g of the solution was added to a vial containing 0.2784 g diisocyanate-terminated polypropylene glycol (MW=2471) (matrix precursor) and 0.05 g α,ω-dihydroxypolypropylene glycol (MW=425) (matrix precursor). The mixture was thoroughly mixed and allowed to polymerize overnight at room temperature, while protected from light. The polymerization was a step polymerization of the isocyanate groups with the hydroxyl groups to form a polyurethane with dissolved acrylate monomers. The mixture appeared clear and transparent to the naked eye. Upon exposure to an intense tungsten light, which initiated polymerization of the acrylate monomers, the material turned milky white, indicating that the polyurethane matrix and acrylate polymers were not compatible.

Consultation of the polymer miscibility table published by Krause, referenced above, shows that polyurethanes are miscible, and thus compatible, with Saran®, a chlorinated polymer. Example 1 reflects a system made using this information.

EXAMPLE 1

A solution was prepared containing 98.86 wt. % 4-chlorophenyl acrylate and 1.14 wt. % dibutyltin dilaurate. 0.017 g of this solution was added to a vial containing 0.2519 g diisocyanate-terminated polypropylene glycol (MW=2471), 0.047 g α,ω-dihydroxypolypropylene glycol (MW=425), 0.051 g 4-chlorophenyl acrylate, and 0.00063 g Ciba CGI-784 (photoinitiator). The mixture was thoroughly mixed and allowed to cure overnight at room temperature, while protected from light. The polymerization was a step polymerization of the isocyanate groups with the hydroxyl groups to form a polyurethane with dissolved chlorophenyl acrylate monomer. The mixture appeared clear and transparent to the naked eye. Upon exposure to an intense tungsten light, which initiated polymerization of the acrylate monomer, the sample remained clear and transparent, indicating the compatibility of the monomer and the matrix polymer.

EXAMPLE 2

0.00265 g Ciba CGI-784 was dissolved in 0.26248 g styrene (photoactive monomer). The solution was mixed with 1.9187 g polypropyleneglycol diglycidyl ether (MW=380) (PPGDGE) (matrix precursor), 1.2428 g pentaerythritoltetrakis(mercaptopropionate) (PETMP) (matrix precursor), and 0.1445 g tris(2,4,6-dimethylaminomethyl)phenol (TDMAMP) (catalyst for matrix formation). The:mixture was dispensed on a glass slide, into an approximately 200 μm thick, 25 mm diameter Teflon spacer, and second glass slide was placed thereon. After about one hour at room temperature, the mixture gelled due to the amine-catalyzed copolymerization of the mercaptan with the epoxy. Differential scanning calorimeter (DSC) and Fourier transform infrared (FTIR) measurements indicated that polymerization of the matrix was complete after two hours (i.e., no measurable amount of precursor functional groups). A tough, elastomeric material was obtained, consisting of an epoxy-mercaptan matrix containing dissolved styrene monomer and photoinitiator. The thickness of the medium was about 270 to 290 μm. After 24 hours, a series of multiplexed holograms were written into the medium, in accordance with the procedure of U.S. Pat. No. 5,719,691, referenced previously. A Δn of $1.7 \times 10^{-3}$ was achieved. No abnormal light scattering was detected after holographic recording, indicating compatibility between the polymerized styrene monomer and the epoxy-mercaptan matrix.

EXAMPLE 3

To increase the Δn of the medium above that produced from Example 2, bromostyrene monomer was used as the photoactive monomer. 0.01262 g Ciba CGI-784 was dissolved in 0.2194 g 4-bromostyrene (photoactive monomer). The solution was mixed with 0.9597 g PPGDGE, 0.6042 g PETMP, and 0.084 g TDMAMP. Samples were prepared and holograms recorded as in Example 2. An average Δn of $4.2 \times 10^{-3}$ was attained. Again, no abnormal light scattering was detected after holographic recording, and, in addition, DSC. showed only one glass transition temperature, suggesting a compatible system.

EXAMPLE 4

0.054 g Ciba CGI-784 was dissolved in 0.46 g 4-bromostyrene. The solution was mixed with 3.8 g PPGDGE, 2.44 g PETMP, and 0.3 g TDMAMP. This corresponds to half the concentration of bromostyrene used in Example 3. Samples were prepared and holograms recorded as in Example 2. A Δn of $2.5 \times 10^{-3}$ was attained. The decrease in thickness (shrinkage) induced by polymerization of the bromostyrene was about 0.3%. The elastic modulus of the photorecording material was about $5.7 \times 10^6$ Pa.

EXAMPLE 5

4-methylthio-1-vinylnaphthalene (MTVN); (photoactive monomer) was synthesized by the following procedure: 1-methylthionaphthalene preparation: 63. g (0.25 mol) of 1-iodonaphthalene was dissolved in 1 L of anhydrous ether under nitrogen. The solution was cooled to −70° C., and 109 mL of 2.5 M butyllithium (BuLi) in hexane (0.27 mol) was added over 30 min. with stirring. 25 g (0.27 mol) of dimethyl disulfide was added and the solution was allowed to warm to room temperature over 4 hours. 200 mL of concentrated aqueous $Na_2CO_3$ was added and the organic layer was dried with $MgSO_4$, filtered, and then concentrated to a dark orange oil containing 42 g (97%) of product and also containing about 10 g of butyl iodide by-product. All glassware and other apparatus was cleaned with bleach to decompose the residual sulfides.

4-methylthio-1-naphthaldehyde preparation. 14.5 g of 1-methylthionaphthalene (0.083 mol) was mixed with 12.4 g (0.17 mol) of anhydrous N,N-dimethylformamide and the solution cooled with an ice bath. 23.9 g (0.095 mol) of diphosphoryl tetrachloride was added dropwise with stirring, keeping the temperature below 15° C. The mixture was slowly heated to 100° C. and continually stirred at that temperature for 2 hours. The mixture was allowed to cool and was then chilled with an ice bath. A solution of 23 g of NaOH in 200 mL of water (cooled by adding 100 g of ice) was poured into the reaction mixture, and the combined mixtures were gently warmed to 40° C. with stirring. At this point, an exothermic reaction began, the heat-was removed, and more ice was added to keep the temperature below 50° C. When the temperature stabilized below 35° C., 200 mL of ether was added with stirring. The organic layer was separated and the aqueous layer extracted with 100 additional mnL of ether. The combined ether extracts were dried with $MgSO_4$, filtered, concentrated, and chromatographed on a column of 120 g of silica gel, eluting with 500 mL portions of hexane containing 0, 25, 50, and 75 volume % of $CH_2Cl_2$ and collecting 100 mL fractions. The product was collected from 6–8 of these fractions, yielding 9.8 g (58%) of yellow solid. 4-methylthio-1-vinylnaphthalene preparation: A suspension of 19.9 g (0.058 mol) of methyltriphenylphosphonium bromide powder in 150 mL of anhydrous tetrahydrofuran was cooled to 0° C. with stirring under nitrogen. 19 mL of 2.5 M BuLi in hexane (0.48 mol) was added over 30 minutes, keeping the color as light as possible and avoiding a dark orange coloration. The mixture was allowed to warm to 25° C., stirred 1 hour at that temperature, and cooled to 0° C. 9.8 g of 4-methylthio-1-naphthaldehyde dissolved in 20 mL of tetrahydrofuran was added over 30 minutes, maintaining the stirring at 0° C. The mixture was stirred overnight, allowing the temperature to rise to ambient. 10 mL of methanol was added, and the solvents evaporated at reduced pressure. The residue was extracted with 5 portions of 100 mL of ligroin (mainly heptanes) at its boiling point of 90–110° C., keeping the residue soft by adding additional methanol. The extracts were filtered, concentrated, and eluted through 40 g of silica gel with hexane. Product was obtained from a 500 mL fraction, yielding 6.8 g pale yellow liquid (70%) which was stored at −20° C. in the form of an off-white solid.

Medium preparation: 0.0562 g Ciba CGI-784 was dissolved in 0.1 g 4-bromostyrene and 0.4 g MTVN under gentle heating. The solution was mixed with 2.4 g PPGDGE, 1.508 g PETMP, and 0.2 g TDMAMP. Samples were prepared and holograms recorded as in Examples 2 and 3. $\Delta n$ values as high as $6.2 \times 10^{-3}$ were attained for thicknesses of 200 µm.

EXAMPLE 6

0.26 g CGI-784 photoinitiator was dissolved in 2.225 g of 4-bromostyrene. This solution was mixed with 19 g PPGDGE, 12.2 g PETMP, and 0.34 g 1,8-diazobicyclo [5.4.0]undec-7-ene (DBU). The mixture gelled in 7 minutes, and matrix polymerization was completed after 15 minutes. Multiplexed holograms were successfully recorded in this medium.

EXAMPLE 7

A sample having a material thickness of 940 µm (not including the glass slides) was prepared as follows. 0.75 g Ciba CGI-784 was dissolved in 1.50 g MTVN under gentle heating. The solution was mixed with 9.04 g PPGDGE, 5.64 g PETMP, and 0.56 g TDMAMP. Media up to 1 mm thick were prepared using vacuum holders, as mentioned previously and holograms were recorded as in Example 2. A $\Delta n$ of $7.3 \times 10^{-3}$ was measured for the sample, demonstrating that it is possible to increase the sample thickness while substantially maintaining $\Delta n$.

EXAMPLE 8

Five media were prepared to compare effects of differing photoactive monomers. The media had material thicknesses of 250 µm, and were prepared as follows:

1) Styrene photoactive monomer: prepared as in Example 2.
2) Bromostyrene photoactive monomer: prepared as in Example 3.
3) Bromostyrene and MTVN photoactive monomers: prepared as in Example 5.
4) MTVN photoactive monomer: prepared as in Example 7.
5) 1-(3-naphth-1-ylthio)propylthio)-4-vinylnaphthalene (NTPVN) photoactive monomer: 0.02 g CIBA CGI-784 was dissolved in 1.2007 g of PPGDGE. The solution was mixed with 0.4080 g NTPVN, 0.7524 g PETMP and 0.1358 g TDMAMP. Samples were prepared as in Example 2.

Figure 2:
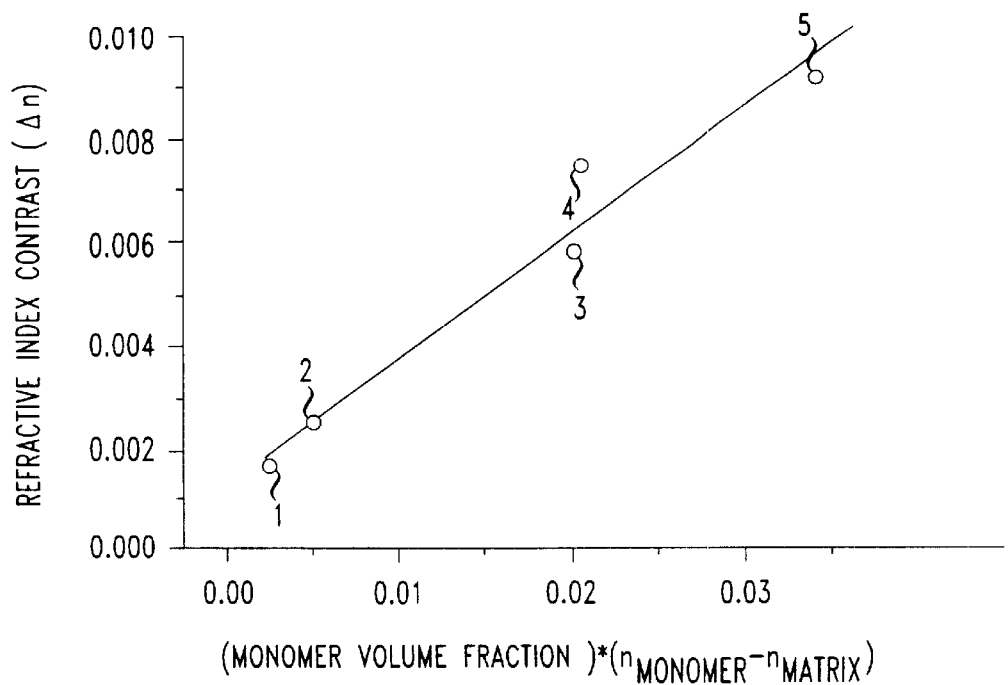
FIG. 2 shows the effect of several different photoactive monomers on a recording medium's refractive index contrast.

Thirty five plane wave holograms were angle-multiplexed into the samples using the above holographic apparatus. The samples were flood exposed after writing to react any remaining photoactive species. The refractive index contrasts were calculated, and are shown in FIG. 2 (with a best-fit line), using the reference numbers immediately above. FIG. 2 shows that from medium 1 to medium 5, an increase in refractive index contrast from about $1.6 \times 10^{-3}$ to about $9 \times 10^{-3}$ was realized, while maintaining a relatively constant level of dimensional stability. (a decrease of ~0.3% in the thickness of the medium). The increased refractive index contrast exhibited by the medium containing 1-(3-naphth-1 -ylthio)propylthio)-4-vinylnaphthalene is to be expected, given the presence on the monomer of 2 index-contrasting moieties.

(The NTPVN was prepared as follows:
Preparation of 1-(3-(naphth-1-ylthio)propylthio) naphthalene. A solution of 20.7 g (0.1 mol) of 1-bromonaphthalene in 200 mL of ether was cooled to −78° with stirring, and 40 mL of BuLi was added. The temperature was allowed to rise to −20° C., and lowered back to −78° C., at which time 3.2 g (0.1 mol) sulfur was added. The temperature was allowed to rise to 10° C., and lowered back to −78° C., at which time 14.8 g (0.05 mol) 1,3-diiodopropane was added. As the mixture was warmed to room temperature, a sluggish reaction was noted by thin layer chromatography. The mixture was heated for 4 hours at reflux in the presence of 50 mL of THF, and worked up (after cooling) with aqueous NaOH. The organic layer was dried with $MgSO_4$, filtered, concentrated, and chromatographed on 100 g of silica gel eluting with 2 L of 0–30% $CH_2Cl_2$ in hexane. A 900 mL product band gave 5.5 g of a white solid, indicated to be pure by NMR.

Preparation of 4-(3-(naphth-1-ylthio)propylthio)-1-naphthaldehyde. 3.9 g of the above product and 1.42 g dimethylformamide were mixed with ice cooling, followed by the addition of 2.8 g of $P_2O_3Cl_4$. The mixture was heated at 100° C. for 2 hours, cooled to ambient temperature, and hydrolyzed by adding 2.5 g of NaOH in 50 mL of ice water, heating to 40° C., and stirring the mixture at ambient temperature. When the organic material became dispersed, it was extracted into ether, dried, filtered, concentrated, and chromatographed with 750 mL of a hexane-$CH_2Cl_2$ gradient, followed by 10% EtOAc in $CH_2Cl_2$. A total of 2.0 g of starting material, 1.3 g of yellow oily product, and 0.2 g of dialdehyde were obtained. The product yield was 31%, or 63% based on the consumed starting material.

Preparation of 1-(3-(naphth-1-ylthio)propylthio)-4-vinylnaphthalene. 1.3 g of the above product was added to a Wittig reagent (prepared from 1.4 g of methyltriphenylphosphonium bromide and 3.3 mmol (1 equiv) of BuLi in 30 mL of THF at 0° C. to room temperature over 1 hours and recooled to 0° C.). After stirring overnight at ambient temperature, 1.6 mL of MeOH was added, and the solution was concentrated and extracted with ligroin as for the MTVN. The extract was partially concentrated to about 10 mL, diluted with $CH_2Cl_2$ to homogeneity, and chromatographed on 20 g of silica gel, eluting with 1:1 hexane:$CH_2Cl_2$. The yield was 1.1 g (84%) of a viscous yellow oil, indicated to be pure by NMR. After drying 30 min. at vacuum, the material was immediately blended into the mixture for medium preparation.)

Other embodiments of the invention will be apparent to those skilled in the art from consideration of the specification and practice of the invention disclosed herein.

What is claimed is:

1. An optical article comprising:
   a three-dimensional cross-linked polymer matrix, and one or more polymers formed from one or more photoactive monomers,
   wherein the matrix was formed by a polymerization reaction selected from cationic epoxy polymerization, cationic vinyl ether polymerization, cationic alkenyl ether polymerization, cationic allene ether polymerization, cationic ketene acetal polymerization, epoxy-amine step polymerization, epoxy-mercaptan step polymerization, unsaturated ester-amine step polymerization, unsaturated ester-mercaptan step polymerization, vinyl-silicon hydride step polymerization, isocyanate-hydroxyl step polymerization, and isocyanate-amine step polymerization,
   wherein at least one of the photoactive monomers comprised a moiety, other than the monomer functional group, that is substantially absent from the polymer matrix,
   wherein the polymer matrix and the one or more polymers formed from the one or more photoactive monomers are compatible,
   wherein the matrix has a thickness greater than 200 μm, and
   wherein the polymer matrix was formed, in the presence of the one or more photoactive. monomers, by a polymerization reaction independent from a reaction by which the one or more photoactive monomers were polymerized.

2. An optical article comprising:
   a three-dimensional cross-linked polymer matrix, and one or more polymers formed from one or more photoactive monomers,
   wherein the matrix was formed by a polymerization reaction selected from cationic epoxy polymerization, cationic vinyl ether polymerization, cationic alkenyl ether polymerization, cationic allene ether polymerization, cationic ketene acetal polymerization, epoxy-amine step polymerization, epoxy-mercaptan step polymerization, unsaturated ester-amine step polymerization, unsaturated ester-mercaptan step polymerization, vinyl-silicon hydride step polymerization, isocyanate-hydroxyl step polymerization, and isocyanate-amine step polymerization,
   wherein at least one of the photoactive monomers comprised a moiety, other than the monomer functional group, that is substantially absent from the polymer matrix,
   wherein the polymer matrix and the one or more polymers formed from the one or more photoactive monomers are compatible,
   wherein the matrix has a thickness greater than 200 μm,
   wherein the polymer matrix was formed, in the presence of the one or more photoactive monomers, by a polymerization reaction independent from a reaction by which the one or more photoactive monomers were polymerized, and
   wherein the one or more photoactive monomers are selected from acrylates, methacrylates, acrylamides, methacrylamides, styrene, substituted styrenes, vinyl naphthalene, substituted vinyl naphthalenes, vinyl ether mixed with maleate, thiol mixed with olefin, vinyl ethers, alkenyl ethers, allene ethers, ketene acetals, and epoxies.

* * * * *